United States Patent [19]

Schuon

[11] 4,156,183
[45] May 22, 1979

[54] METHOD OF AND MEANS FOR MEASURING THE LEVEL OF TEST SIGNALS OVER SELECTED WIDE BAND FREQUENCY RANGES

[75] Inventor: Eberhard Schuon, Eningen, Fed. Rep. of Germany

[73] Assignee: Wandel & Goltermann, Eningen, Fed. Rep. of Germany

[21] Appl. No.: 814,099

[22] Filed: Jul. 8, 1977

[30] Foreign Application Priority Data

Jul. 10, 1976 [DE] Fed. Rep. of Germany ....... 2631202

[51] Int. Cl.² ............... G01R 19/22; G01R 23/14; G01R 1/20
[52] U.S. Cl. ............... 324/77 A; 324/79 R; 324/128
[58] Field of Search ........... 324/128, 79 R, 77 CS, 324/78 E, 103 P, 77 A

[56] References Cited

U.S. PATENT DOCUMENTS 2,899,639  8/1959  Shepherd ............... 324/79 R
3,303,422  2/1967  Lucius ............... 324/79 R Primary Examiner—Rudolph V. Rolinec
Assistant Examiner—Ernest F. Karlsen
Attorney, Agent, or Firm—Karl F. Ross

[57] ABSTRACT

To measure the level of test signals over a frequency range of variable bandwidth B, bounded by a lower frequency $f'$ and an upper frequency $f''$, these signals are heterodyned with a variable modulating frequency to produce a frequency spectrum encompassing the pass band of an intermediate-frequency filter of fixed bandwidth $b \leq B$, centered on a frequency $f_c$. By periodically shifting the modulating frequency between a minimum value of $f' - f_c + (b/2)$ and a maximum value of $f'' - f_c - (b/2)$, either continuously or in steps, the frequency range of bandwidth B is scanned by a window of bandwidth b transposed to the pass band of the filter as the midfrequency $f_m$ of the window varies in a sweep cycle between $f' + b/2$ and $f'' - b/2$. The signal level in the output of the filter, integrated over the sweep cycle, is weighted with a corrective factor B/b.

14 Claims, 9 Drawing Figures

METHOD OF AND MEANS FOR MEASURING THE LEVEL OF TEST SIGNALS OVER SELECTED WIDE BAND FREQUENCY RANGES

FIELD OF THE INVENTION

My present invention relates to a method of and a system for measuring the level of test signals within a selectivity variable wide frequency range.

BACKGROUND OF THE INVENTION

In carrier telecommunication, for example, it is desirable to measure the power level of incoming signals over an entire base-band as it appears in its transposed frequency position, e.g. in a range of 60–180 kHz or of 312–552 kHz as conventionally used for 12-channel or 60-channel voice transmission. Systems are known, e.g. from commonly owned U.S. Pat. Nos. 3,461,385, 3,480,862 and 3,486,112, which allow the exploration of the signal level in any desired narrow-band section of such a wide frequency range by heterodyning the incoming test signals with a modulating frequency so chosen that the resulting beat-frequency oscillations clear an intermediate-frequency filter; by periodically shifting or "wobbling" the modulating frequency between suitable limits, continuously or in steps, information can be gained on the magnitude of the signal level throughout the range of interest (see brochures on Selective Level Meters SPM-6 and SPM-60 of Wandel u. Goltermann, the assignee of my present application). Such information, however, does not provide a numerical value for the entire range which could be compared with a standard and which would enable an evaluation of the performance of the overall transmission system under different operating conditions. Currently available wide-band level meters are generally limited to bandwidths not exceeding 48 kHz, owing to the imperfections of intermediate-frequency filters with large pass bands; they are, moreover, restricted to specific frequency ranges whose spread could be narrowed (but not widened), in a rather cumbersome manner, only with the aid of additional filters in cascade therewith.

OBJECTS OF THE INVENTION

The general object of my present invention, therefore, is to provide a method of and a system for measuring the level of test signals within a wide frequency range having freely selectable limits.

A more particular object is to provide a system of this type which uses only one fixed intermediate-frequency filter for any of the various ranges that can be selected.

It is also an object of my invention to provide means in a system of this character enabling level measurements to be read, e.g. in decibels, on a meter or digital indicator which need not be readjusted with changes in the limiting frequencies of the range.

SUMMARY OF THE INVENTION

In accordance with one aspect of my present invention, the level of test signals is determined over a desired frequency range of variable bandwidth B by establishing a frequency window of fixed width $b \leq B$ within that range and shifting this window in the presence of the test signals across the range in a preferably periodically recurrent sweep cycle in which the midfrequency $f_m$ of the window varies between a minimum value $f'+b/2$ and a maximum value $f''-b/2$ where $f'$ and $f''$ are the lower and upper limiting frequencies of the range. The signal amplitudes appearing in the window, in any of its shift positions, are integrated throughout the sweep cycle and are multiplied by a corrective factor proportional to bandwidth B. In the extreme case of $B=b$, in which $F'+b/2=f''-b/2$, that factor is unity and no sweep takes place.

If the level of the integrated signal amplitudes is conventionally read out in decibels, with reference to a predetermined standard signal of one milliwatt, for example, the multiplication factor should have the value $B/b$ and can be imposed by augmenting the reading of an analog or digital indicator with an increment of magnitude $10 \log B/b$. As the equivalent of such a logarithmic addition, the gain of an amplifier or the attenuation of an impedance network can be correspondingly adjusted.

According to another aspect of my invention, a system for carrying out the aforedescribed method includes a generator of a variable modulating frequency ranging in magnitude between a minimum value $f'-f_c+b/2$ and a maximum value $f''-f_c-b/2$, that modulating frequency being heterodyned in a mixer stage with incoming test signals received by an input circuit. The mixer stage works into a filter of pass band b whose output is delivered to an evaluator including rectification, storage and weighting circuitry for integrating the RMS values of the instantaneous signal voltages, passing the filter in the form of beat-frequency oscillations, over a sweep cycle during which the modulating frequency is periodically varied to shift the aforementioned window midfrequency $f_m$ between the limits $f'+b/2$ and $f''-b/2$, with imposition of the corrective factor B/b either before or after integration. Such integration can be performed in an R/C network, with a time constant substantially exceeding a sweep cycle of the scanning means by which the modulating frequency is varied continuously or in steps, or in an arithmetic unit after conversion of the rectified signal voltages from analog to digital form.

Advantageously, pursuant to a further feature of my invention, the corrective factor is modified automatically under the control of a range selector whenever the value of B is changed. The range selector can be part of the arithmetic unit already referred to which calculates the multiplication factor B/b (or the equivalent additive increment $10 \log B/b$) from the difference between the selected limiting frequencies $f''$ and $f'$.

BRIEF DESCRIPTION OF THE DRAWING

The above and other features of my invention will now be described in detail with reference to the accompanying drawing in which.

SPECIFIC DESCRIPTION

Figure 1:
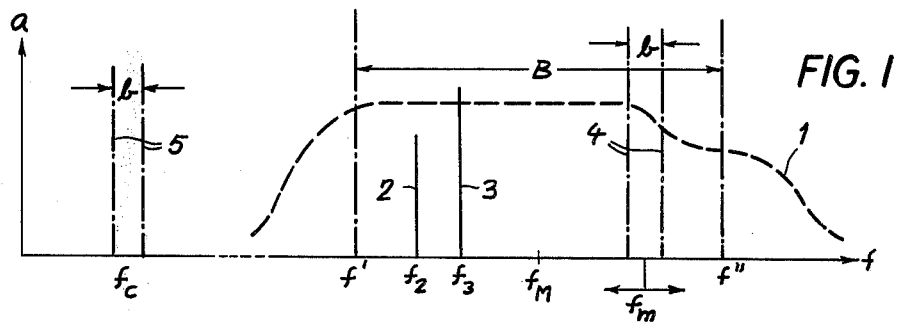
FIG. 1 is a frequency diagram encompassing a selected range within which the level of test signals is to be measured.

In FIG. 1 I have shown the density spectrum 1 of a test signal, with amplitudes a plotted against frequency f, which may include several pilot oscillations 2, 3 of frequencies $f_2$, $f_3$ used for calibration purposes. The signal level is to be measured within a range of bandwidth B bounded by a lower limiting frequency f' and an upper limiting frequency f" at least one of which is selectively variable, the midfrequency of that range being indicated at $f_M$.

A frequency window 4 of fixed bandwidth b, here shown to be much smaller than B, is virtually shiftable—in a manner more fully explained hereinafter—between limiting frequencies f' and f", i.e. from a bottom position in which its own midfrequency $f_m$ has a value f'+b/2 to a top position in which $f_m$=f"−b/2. Window 4 may be defined by the pass band 5 of a fixed-frequency filter 16 (FIGS. 6-9) of the same bandwidth b, with a center frequency $f_c$ outside (here below) the test range f'-f". When the test signal 1 is heterodyned with a modulating frequency varying with a stroke of length B−b between two values f'−$f_c$+b/2 and f"−$f_c$−b/2 (or $f_M$−$f_c$−(B−b/2) and $f_M$−$f_c$+(B−b/2), the window 4 effectively scans the test range so that beat-frequency voltages successively appearing in the output of the filter have amplitudes corresponding to the amplitudes a of signal 1 within that range. Rectification of these beat-frequency voltages and integration of their RMS values over a sweep cycle yields an output voltage $V_o$ from which a reading of signal power in decibels can be conventionally derived by taking ten times the logarithm of the ratio $(V_o/V_r)^2$ where $V_r$ is a reference voltage obtained, for example, by energizing a resistance of 600 Ω with a standard signal of 1mW. This, however, fails to take into account the fact that the window 4 dwells on a given signal component only for a fraction of a sweep cycle corresponding to the ratio b/B; thus, according to an important feature of my invention, the ratio $(V_o/V_r)^2$ is to be multiplied by a corrective factor B/b, which is equivalent to adding an increment of 10 log B/b to the conventionally obtained decibel reading. Naturally, gains or losses occurring elsewhere in the circuits must be considered in determining this corrective factor.

Figure 2:
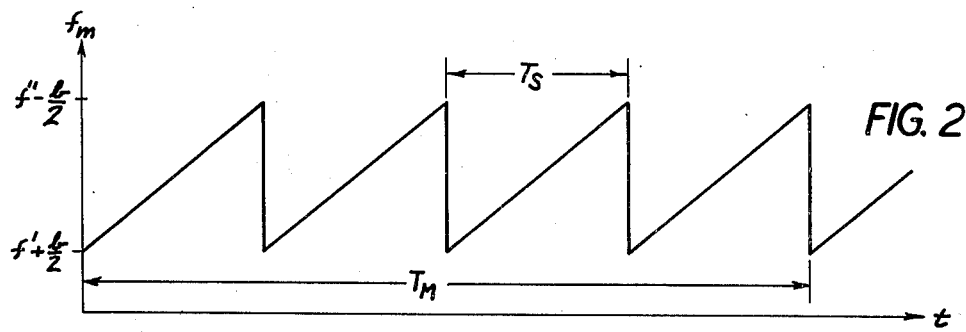
FIGS. 2–4 are graphs showing various types of sweep for scanning the frequency range of FIG. 1.
Figure 3:
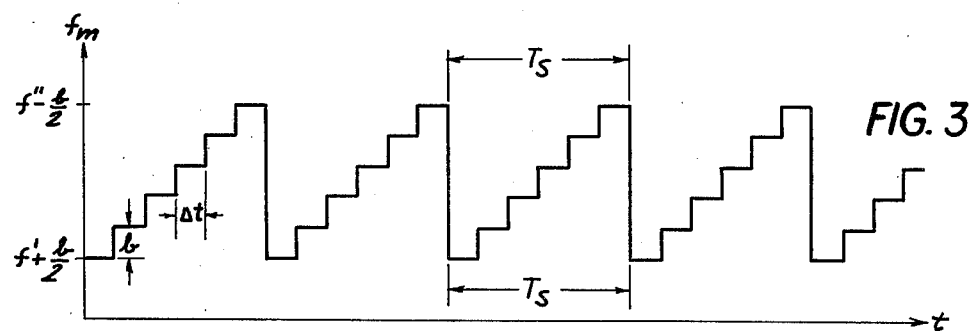
Figure 4:
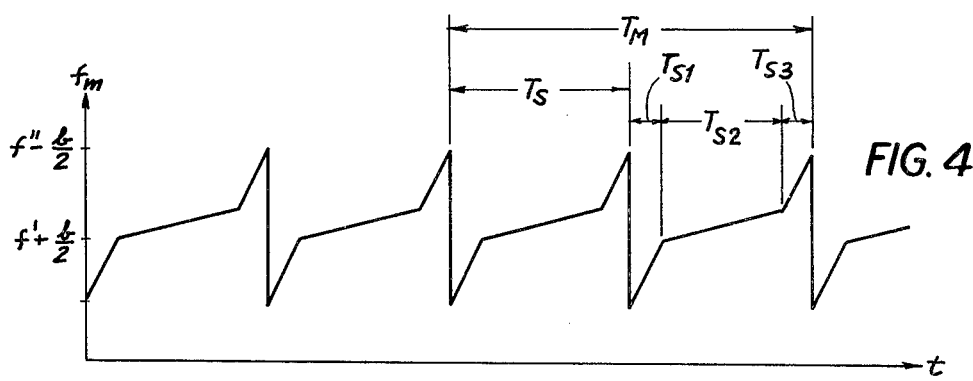

The foregoing observations apply, strictly speaking, only to the case of a linear scan, such as the sawtooth sweep shown in FIG. 2, or of a quasi-linear scan such as the illustrated in FIG. 3, with each step having a height b and a constant duration Δt. In some instances, however, it may be desirable to emphasize or de-emphasize the contributions of certain parts of the test range to the overall signal level; such differential weighting can be conveniently accomplished by selectively modifying the scanning rate, e.g. as shown in FIG. 4 where a sweep cycle $T_S$ is subdivided into an initial fast-scanning period $T_{S1}$, an intermediate slow-scanning period $T_{S2}$ and a final fast-scanning period $T_{S3}$. The resulting de-emphasis of the contributions of the lowest and highest reaches of the test range can also be realized with a stepped sweep, of the type shown in FIG. 3, by increasing the duration of the bottom and top steps relative to that of the intermediate steps.

In each of the scanning patterns shown in FIGS. 2-4, the midfrequency $f_m$ of window 4 is effectively shifted from a minimum value f'+b/2 to a maximum value f"−b/2 in the course of a recurrent sweep cycle $T_S$. The evaluation of the test results, including storage and integration of the rectified voltages prior to a readout of the overall signal level in analog or digital form, takes place during a measuring period $T_M$ which may be equal to a sweep cycle $T_S$ (as shown in FIG. 3) or a multiple thereof (e.g. four sweep cycles, as in FIG. 2, or two sweep cycles, as in FIG. 4).

Figure 5:
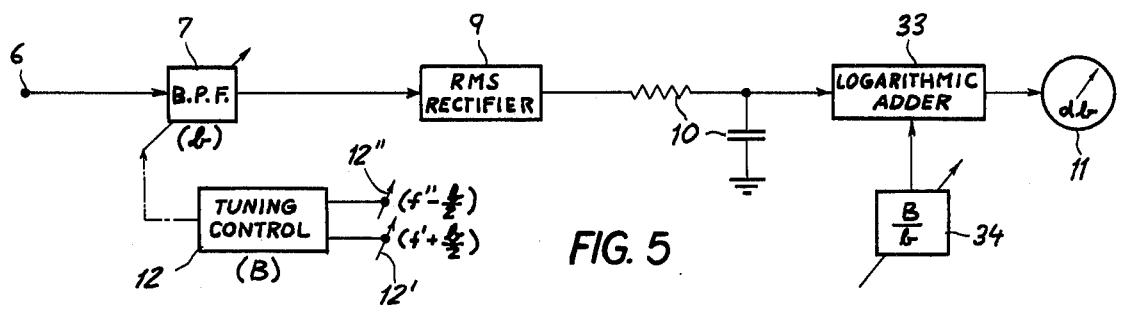
FIG. 5 is a block diagram of a system according to my invention for measuring signal levels in the frequency range of FIG. 1.

The system shown in FIG. 5, designed to implement the above-described method of signal-level measurement, comprises an input terminal 6 connected to a tunable band-pass filter 7 whose pass band has a substantially constant width b and is shiftable by means of a control unit 12 within a selected frequency range, the width B of that range being variable by changing the limiting positions F'+b/2 and f"−b/2 of its central frequency $f_c$ with the aid of selectors 12' and 12". Control unit 12 may comprise a motor periodically adjusting the tuning of filter 7 in a sawtooth or stepped pattern, as shown in FIGS. 3 and 4, or in a succession of symmetrically triangular sweeps of continuous or quasi-continuous character. The output of filter 7 passes into an RMS rectifier 9 charging a capacitor of an R/C network 10 which integrates the rectified signal voltages. Network 10, whose time constant substantially exceeds the length of a measuring period $T_M$, feeds a logarithmic adder 33 also receiving the corrective factor B/b from a voltage generator 34 in order to give a reading of 20 log $(V_o/V_r)^2$+10 log B/b on a meter 11 calibrated in decibels. Voltage generator 34 may be set manually or automatically in conformity with the selected bandwidth B=f"−f'. Adder 33 may include a sampling-and-holding network, of the type shown in FIG. 6 and described hereinafter, synchronized with the scan-control unit 12 to make each measuring period $T_M$ equal to a sweep cycle $T_S$ or a multiple thereof.

Figure 6:
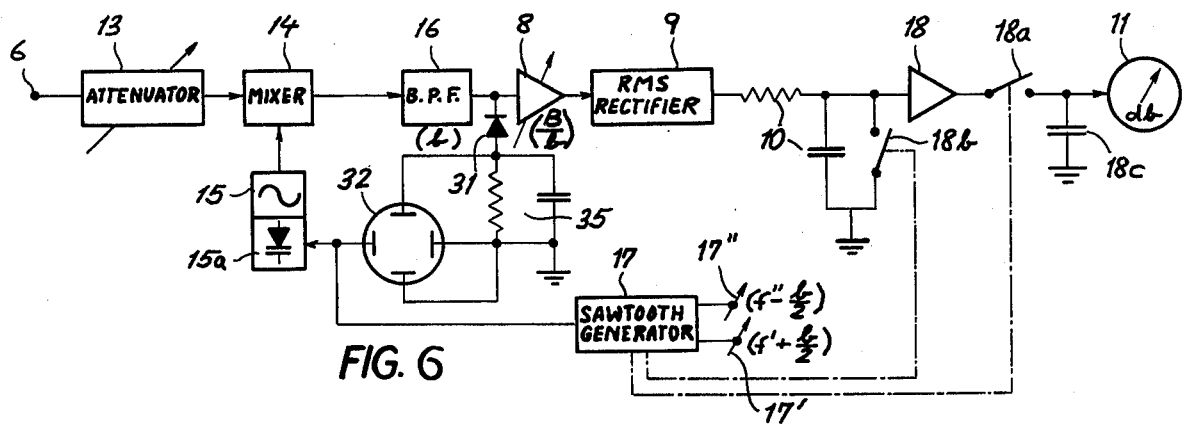
FIGS. 6 and 7 are block diagrams showing two modified versions of the system of FIG. 5.

In the system of FIG. 6 I have replaced the tunable filter 7 of FIG. 5 by a fixed filter 16 whose pass band is the one shown at 5 in FIG. 1. Input terminal 6 is connected to filter 16 through an adjustable attenuator 13, serving for the calibration of meter 11, in series with a mixer 14 receiving a modulating frequency from an oscillator 15 provided with a tunable tank circuit 15a. The operating frequency of oscillator 15 is controlled by a sawtooth generator 17 which is provided with selectors 17' and 17" for establishing minimum and maximum voltages respectively corresponding to the bottom and top positions of window 4 (FIG. 1) within the chosen test range. The tuning-control voltage issuing from sawtooth generator 17, applied to a varactor in tank circuit 15a, is also fed to a horizontal-deflection electrode of an oscilloscope 32 having a vertical-deflection electrode connected through a diode 31 to the output of filter 16 in order to visualize the distribution of the signal amplitudes across the test range, the voltages rectified by diode 31 being integrated in an R/C network 35. The signals passed by filter 16 are further delivered to an amplifier 8 whose adjustable gain represents the corrective factor B/b; the adjustment of this gain can again be performed manually or automatically. The amplifier signals pass through RMS rectifier 9 into integrating network 10 which is here shown coupled to meter 11 by way of a sampling-and-holding network including an operational amplifier 18, an output switch 18a for periodically transferring the charge of the integrating capacitor to a storage capacitor 18c via amplifier 18, and an output switch 18b for discharging the integrating capacitor immediately thereafter. Switches 18a and 18b, which are preferably of the electronic type, are controlled by generator 17 so as to operate in succession at the end of a measuring period $T_M$ during every $n^{th}$ flyback stroke of the sawtooth voltage (n being equal to 1, 2, 3 etc.). Capacitor 18c is directly connected across meter 11.

Figure 7:
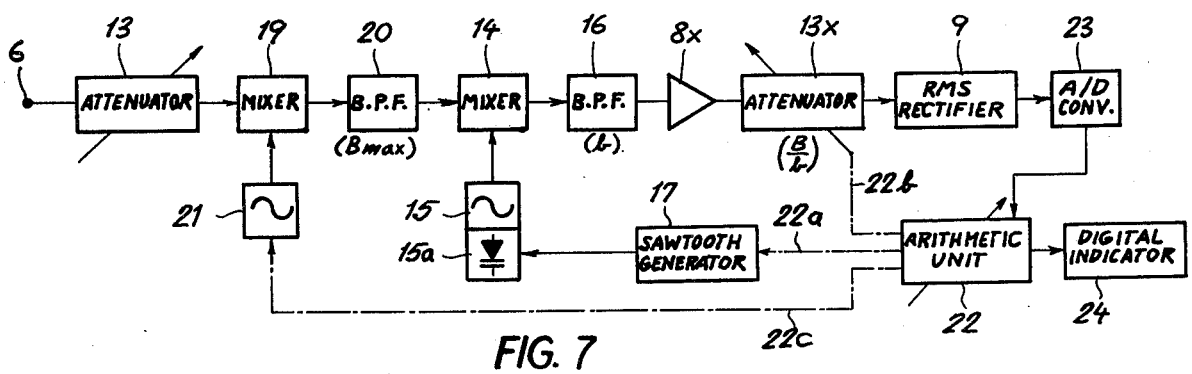

In FIG. 7 I have shown an embodiment of my invention in which another mixer 19, followed by a band-pass filter 20, is inserted between attenuator 13 and mixer 14. An oscillator 21, working into mixer 19, is tunable in coarse steps of height $B_{max}$ and may also be continuously adjustable so as to transpose any desired frequency spread of the same or lesser width into the pass band of filter 20 having the width $B_{max}$. Variable-gain amplifier 8 has been replaced by the combination of a fixed-gain amplifier 8x with a second attenuator 13x, the latter being adjustable to provide the desired corrective factor B/b. RMS rectifier 9 works into an analog/digital converter 23 whose output is algebraically summed and periodically fed to a digital indicator 24 by an arithmetic unit 22 here fulfilling the tasks of integration, storage and transformation to logarithmic form. Unit 22 can be set to a desired test range, of a bandwidth B variable between b and $B_{max}$, and is provided with three outputs 22a, 22b, 22c respectively controlling the sawtooth generator 17, the attenuator 13x and the preselection oscillator 21 so that the corrective factor B/b conforms to the selected bandwidth. Obviously, attenuator 13x and amplifier 8x could be replaced by an additive stage in arithmetic unit 22 supplying the corrective increment 10 log B/b discussed with reference to FIG. 5.

Figure 8:
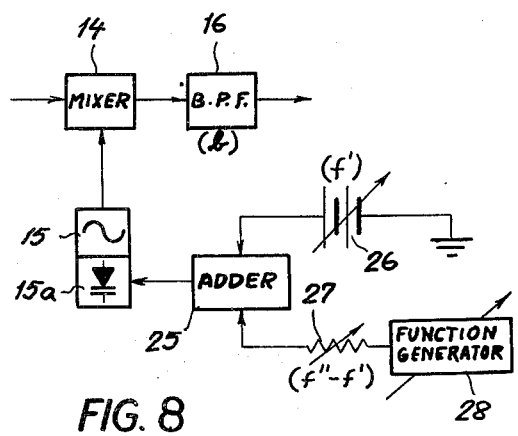
FIGS. 8 and 9 are partial diagrams illustrating further modifications.

FIG. 8 illustrates how the system of FIG. 6 or FIG. 7 can be modified to operate with a sweep pattern of the type shown in FIG. 4 in lieu of a linear sawtooth pattern according to FIG. 2. Thus, the manually or automatically settable sawtooth generator 17 of the preceding embodiments has been replaced by a function generator 28 emitting a voltage of discontinuous slope and of a magnitude adjustable by a potentiometer 27 to determine the bandwidth B=f''−f'. The lower frequency limit f' is established by an adjustable voltage source 26, the two voltages being combined in an adder 25 whose output controls the tank circuit 15a of oscillator 15. Naturally, elements 26 and 27 could also be used in the system of FIG. 7 together with the nonadjustable sawtooth generator 17 in lieu of the function generator 28 to vary the oscillator frequency under the control of arithmetic unit 22.

Figure 9:
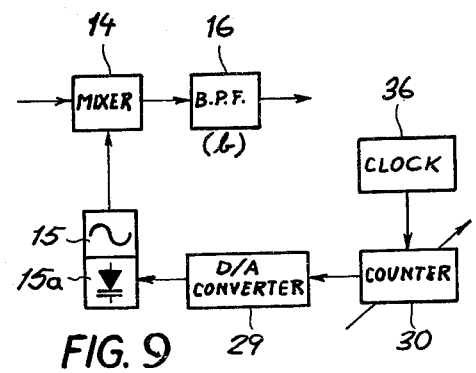

A stepped sweep as shown in FIG. 4 can be obtained by substituting a pulse counter 30, driven by a generator of clock pulses 36, for the sawtooth generator 17 of FIG. 6 or 7 as illustrated in FIG. 9, the digital reading of the counter being translated by a converter 29 into an analog voltage controlling the tank circuit 15a. The initial and final readings of the counter can be selectively preset, manually or automatically, in conformity with the desired test range; when reaching a selected limit, the counter resets or reverses itself as is well known per se.

I claim:

1. A method of determining the level of received test signals over selected frequency ranges of different bandwidths B bounded by a lower limiting frequency f' and an upper limiting frequency f'', comprising the steps of:

establishing a frequency window of fixed width $b \leq B$ within a selected frequency range;

shifting said window in the presence of said test signals across the selected range with the midfrequency $f_m$ of said window varying in a sweep cycle between f'+b/2 and f''−b/2;

integrating the RMS values of signal amplitudes appearing in said window throughout the sweep cycle;

shifting at least one of said limiting frequencies for changing to a different frequency range; and measuring the integrated RMS values of each frequency range after multiplying said values with a corrective factor proportional to the bandwidth B of the respective frequency range.

2. A method as defined in claim 1 wherein the ratio of the integrated RMS values to a predetermined reference signal is converted into a decibel reading, said corrective factor being equal to B/b.

3. A method as defined in claim 2 wherein the multiplication with said corrective factor is performed by augmenting said decibel reading with an increment equal to 10 log B/b.

4. A method as defined in claim 1 wherein the shifting of the window is performed in a periodically recurrent sawtooth sweep.

5. A method as defined in claim 1 wherein the shifting of the window is performed in a succession of steps each equal to said bandwidth b.

6. A method as defined in claim 1 wherein the contribution of the test-signal level in certain parts of the selected range to the integrated signal amplitudes is selectively weighted by discontinuously modifying the shift rate of the window within a sweep cycle.

7. A system for determining the level of received test signals over selected frequency ranges of different bandwidths B, comprising:

input means for receiving test signals lying within a selected frequency range;

filter means having a pass band of substantially constant width $b \leq B$ outside the selectable frequency ranges, said pass band having a fixed center frequency $f_c$;

a generator of variable modulating frequency, ranging in a recurrent sweep between a minimum value f'−$f_c$+b/2 and a maximum value f''−$f_c$−b/2 wherein f' is a lower limiting frequency and f'' is an upper limiting frequency of the selected range;

mixer means connected to said input means upstream of said filter means and further connected to said generator for heterodyning said test signals with said modulating frequency to generate beat-frequency oscillations passed by said filter means, said beat-frequency oscillations corresponding to test signals present in a frequency window of width b centered on a midfrequency $f_m$;

scanning means for periodically varying said modulating frequency between said minimum and maximum values, thereby shifting said midfrequency $f_m$ between limits f'+b/2 and f''−b/2, said scanning means including a range selector operable to vary at least one of said limiting frequencies;

output means including rectification, storage and weighting circuitry connected to said filter means for integrating the RMS values of signal voltages appearing within said frequency window throughout at least one sweep cycle and multiplying said signal voltages by a corrective factor proportional to said bandwidth B; and indicator means connected to said circuitry for giving a reading of the integrated signal voltages so multiplied, said range selector being coupled with said output means for automatically modifying said corrective factor in conformity with the bandwidth B of the selected range.

8. A system as defined in claim 7 wherein said scanning means comprises a sawtooth-wave generator.

9. A system as defined in claim 7 wherein said scanning means comprises a source of stepped voltage.

10. A system as defined in claim 7 wherein said scanning means comprises a function generator producing a periodic control voltage of discontinuously varying slope.

11. A system as defined in claim 7, further comprising an oscilloscope with horizontal and vertical deflecting means respectively connected to said scanning means and to said filter means in parallel with said output means.

12. A system as defined in claim 7 wherein said output means includes an R/C network with a time constant substantially exceeding an operating cycle of said generator.

13. A system as defined in claim 12 wherein said output means further includes a sampling-and-holding network connected to said R/C network and controlled by said scanning means for activation at the end of an operating cycle thereof.

14. A system as defined in claim 7 wherein said output means includes an analog/digital converter followed by an arithmetic unit.

* * * * *